(12) United States Patent
Boyd et al.

(10) Patent No.: US 6,579,407 B1
(45) Date of Patent: Jun. 17, 2003

(54) METHOD AND APPARATUS FOR ALIGNING AND SETTING THE AXIS OF ROTATION OF SPINDLES OF A MULTI-BODY SYSTEM

(75) Inventors: John M. Boyd, Atascadero, CA (US); Aleksander Owczarz, San Jose, CA (US); Miguel Saldana, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 13 days.

(21) Appl. No.: 09/608,286

(22) Filed: Jun. 30, 2000

(51) Int. Cl.⁷ .............................................. H01L 21/306
(52) U.S. Cl. ................. 156/345; 156/345.12; 438/691; 438/692; 438/693
(58) Field of Search ........................... 156/345, 345.12; 438/691–693

(56) References Cited

U.S. PATENT DOCUMENTS

| | | | | |
|---|---|---|---|---|
| 4,450,652 A | * | 5/1984 | Walsh ........................ 51/131.4 |
| 5,823,854 A | * | 10/1998 | Chen ............................... 451/9 |
| 5,839,944 A | * | 11/1998 | Jacobs et al. ................... 451/8 |
| 5,885,135 A | * | 3/1999 | Desorcie et al. .............. 451/41 |
| 6,186,872 B1 | * | 2/2001 | Kimura et al. ................ 451/53 |

OTHER PUBLICATIONS

Peter Godwin, "The Car That Can't Crash", The New York Times Magazine, Jun. 11, 2000.

* cited by examiner

Primary Examiner—Benjamin L. Utech
Assistant Examiner—Duy-Vu Deo
(74) Attorney, Agent, or Firm—Brinks Hofer Gilson & Lione

(57) ABSTRACT

A method and apparatus is disclosed for polishing a semiconductor wafer. A polishing pad including a first surface and a semiconductor wafer including a second surface are aligned to each other. To allow alignment of an axis of rotation of the surfaces, at least one of the first and second surfaces includes an adjustable axis of rotation. After the axis of rotation of the first and second surfaces is aligned, the adjustable axis of rotation is set, preferably with a magneto-rheological fluid or similarly acting material, to maintain a fixed position. Thereafter, the polishing pad is utilized to polish the semiconductor wafer.

17 Claims, 4 Drawing Sheets

METHOD AND APPARATUS FOR ALIGNING AND SETTING THE AXIS OF ROTATION OF SPINDLES OF A MULTI-BODY SYSTEM

FIELD OF THE INVENTION

The invention relates to the alignment of the axis of multi-body systems, including but not limited to multi-body systems for the polishing of semiconductor wafer surfaces. More specifically, the present invention relates to a method and system for dynamic self-alignment of the axis of rotation of a semiconductor wafer surface and a polishing surface.

BACKGROUND

Semiconductor wafers are commonly constructed in layers, where a portion of a circuit is created on a first level and conductive vias are made to connect up to the next level of the circuit. After each layer of the circuit is etched on the wafer, an oxide layer is put down allowing the vias to pass through but covering the rest of the previous circuit level. Each layer of the circuit can create or add unevenness to the wafer that must be smoothed out before generating the next circuit layer.

Chemical mechanical polishing (CMP) techniques are used to polish and planarize the raw wafer and each layer of circuitry added. Available CMP systems, commonly called wafer polishers, often use a rotating wafer carrier head that brings the wafer into contact with a polishing pad rotating in the plane of the wafer surface to be planarized. A chemical polishing agent or slurry containing microabrasives is applied to the polishing pad to polish the wafer. The wafer carrier head then presses the wafer against the rotating polishing pad and is rotated to polish and planarize the wafer. The mechanical force for polishing is derived from the rotating table speed and the downward force on the wafer carrier head.

A conventional way to axially align the rotating polishing pad with the wafer carrier is to use a rigid surface on one body, such as a body that supports the polishing pad, and a gimbal on the other. A problem occurs when the polishing surface of the rotating polishing pad is smaller than the wafer surface, and especially as the polishing surface moves off an edge of the wafer during polishing. Since the gimbaled surface tends to tilt at the edge, alignment of the wafer to the polishing surface becomes difficult, and is preferably accomplished by using all rigid surfaces. Many polishing techniques, such as CMP, however, require at least one dynamic self-aligning surface to align the polished layer to a previously processed underlying layer of the wafer.

Thus, there is a need for a method for polishing wafers where the wafer is dynamically aligned to a polishing surface and then rigidly held in place when the alignment is accomplished.

BRIEF SUMMARY

A method and system are disclosed for automatically aligning and setting an axis of rotation of a semiconductor wafer to a polishing pad, for example, without using a gimbal mechanism usually incorporated into a wafer head, i.e., wafer carrier. After an angle of the axis of rotation is aligned to the pad, the angle is fixed in place. In this manner, the polishing pad can effectively polish a semiconductor wafer that is attached to the wafer head.

According to an aspect of the invention, a polishing pad includes a first surface and a semiconductor wafer includes a second surface. To polish the semiconductor wafer, axis of rotation of the first and second surfaces are aligned to each other. To allow axial alignment of the surfaces, at least one of the first and second surfaces includes an adjustable axis of rotation. After the axis of rotation of the first and second surfaces is aligned, the adjustable axis of rotation is set to maintain the adjusted position. Thereafter, the polishing pad polishes the semiconductor wafer, for example, in a radially symmetric fashion.

DETAILED DESCRIPTION OF THE PRESENTLY PREFERRED EMBODIMENTS

Figure 1:
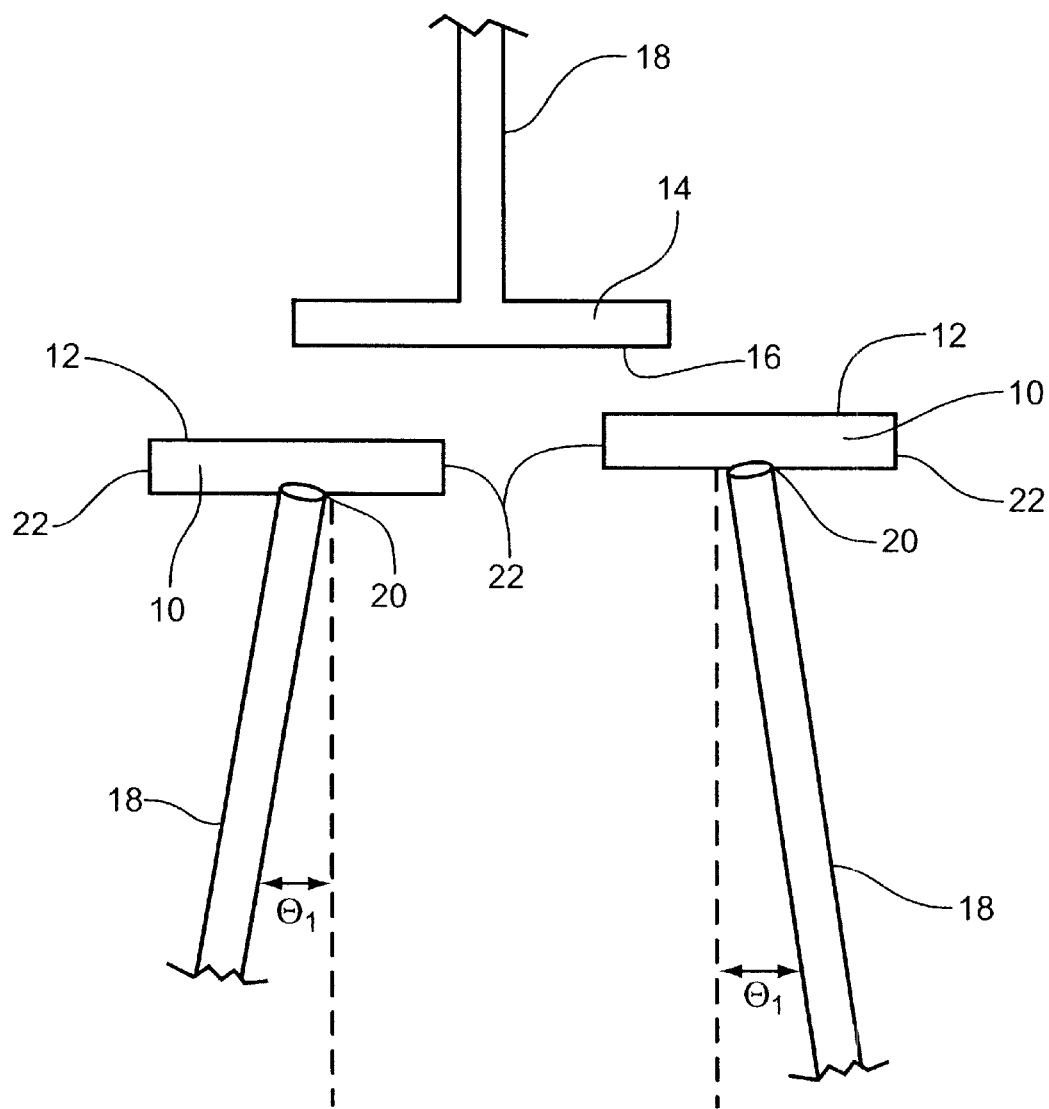
FIG. 1 illustrates a side view of a prior art chemical mechanical polishing system.

Referring to the drawings, and particularly FIG. 1, a conventional angular-motion system is shown for polishing a semiconductor wafer. The system includes at least one wafer carrier head 10 that includes wafer carrier surfaces 12. Also included in the system is a polish head 14 that includes a polishing surface 16. As shown, the system is a three-body system, i.e., one polish head 14 and two wafer carrier heads 10. Of course other combinations of polish heads 14 to wafer carrier heads 10 could be used, such as one polish head 14 and one wafer carrier head 10.

To rotate the polish head 14 and the wafer carrier heads 10, the system includes spindle shafts 18 connected with each of the heads 10, 14. As the spindle shafts 18 rotate, the polishing surface 16 and the wafer carrier surfaces 12 rotate with respect to each other. The rotating wafer carrier head 10 brings the wafer into contact with a polishing pad located on the polishing surface 16. The polishing pad rotates in the plane of the wafer surface to be polished. The chemical polishing agent or slurry is applied to the polishing pad to polish the wafer. In other embodiments, a fixed abrasive polishing pad may be used. The wafer carrier head 10 then presses the wafer against the rotating polishing pad and is rotated to polish the wafer.

To align a surface of the semiconductor wafer to the polishing surface 16 during the polishing, the wafer carrier heads 10 typically include gimbals 20. Because of their flexible nature, the gimbals 20 accommodate changes in parallelism between the wafer carrier heads 10 and the polishing surface 16. In this manner, a difference in an angle $\theta_1$ between the axis of the polish head 14 spindle shaft 18 and the wafer carrier head 10 spindle shaft 18 can be accommodated. A problem occurs, however, in that the gimbaled wafer carrier head 10 can become unaligned with the polish head 14 during polishing, especially as the polish head 14 moves of an edge 22 of the wafer carrier head 10.

Figure 2:
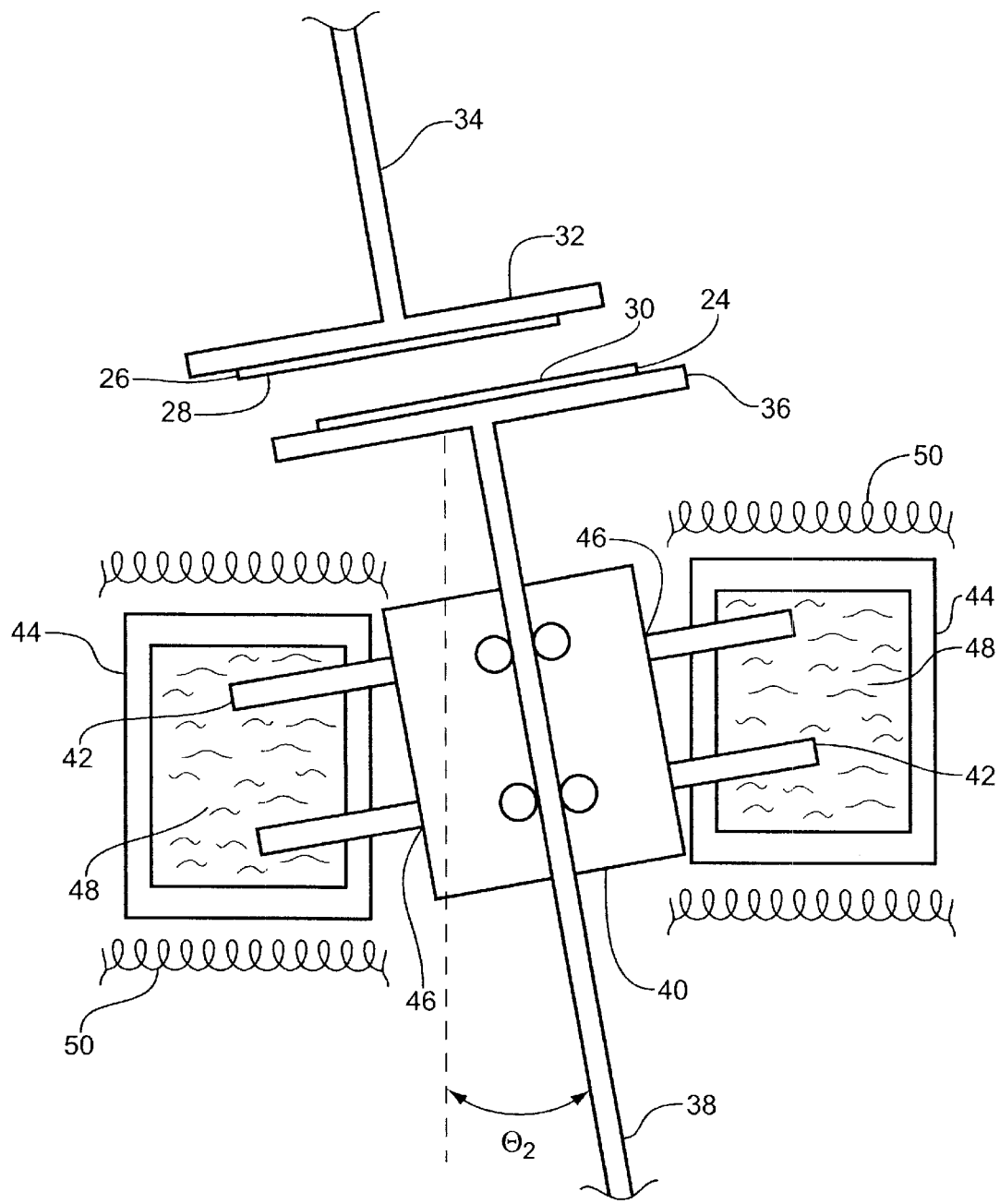
FIG. 2 illustrates a side view of a polishing system according to a first embodiment.

Referring to FIG. 2, a system is shown according to the preferred embodiments for polishing a semiconductor wafer 24. Those skilled in the art will appreciate that while a two-body system is shown, the below described system also applies to multi-body systems. A polishing pad 26 includes a polishing surface 28. The semiconductor wafer 24, which may be comprised of silicon scaled to the dimensions of a given circuit, includes a semiconductor surface 30 to be polished that opposes the polishing surface 28 of the polishing pad 26. The polishing pad 26 engages a polishing head 32 and the polishing head 32 connects with a polishing spindle 34. The semiconductor wafer 24 engages a wafer head 36 and the wafer head 36 connects with a wafer spindle 38. The semiconductor wafer 24 is held in place by a retention device (not shown) and/or by vacuum. At least one of an angle $\theta_2$ of axis of rotation of the wafer head 36 and the polishing head 32, and preferably the wafer head 36, is adjustable.

Figure 3:
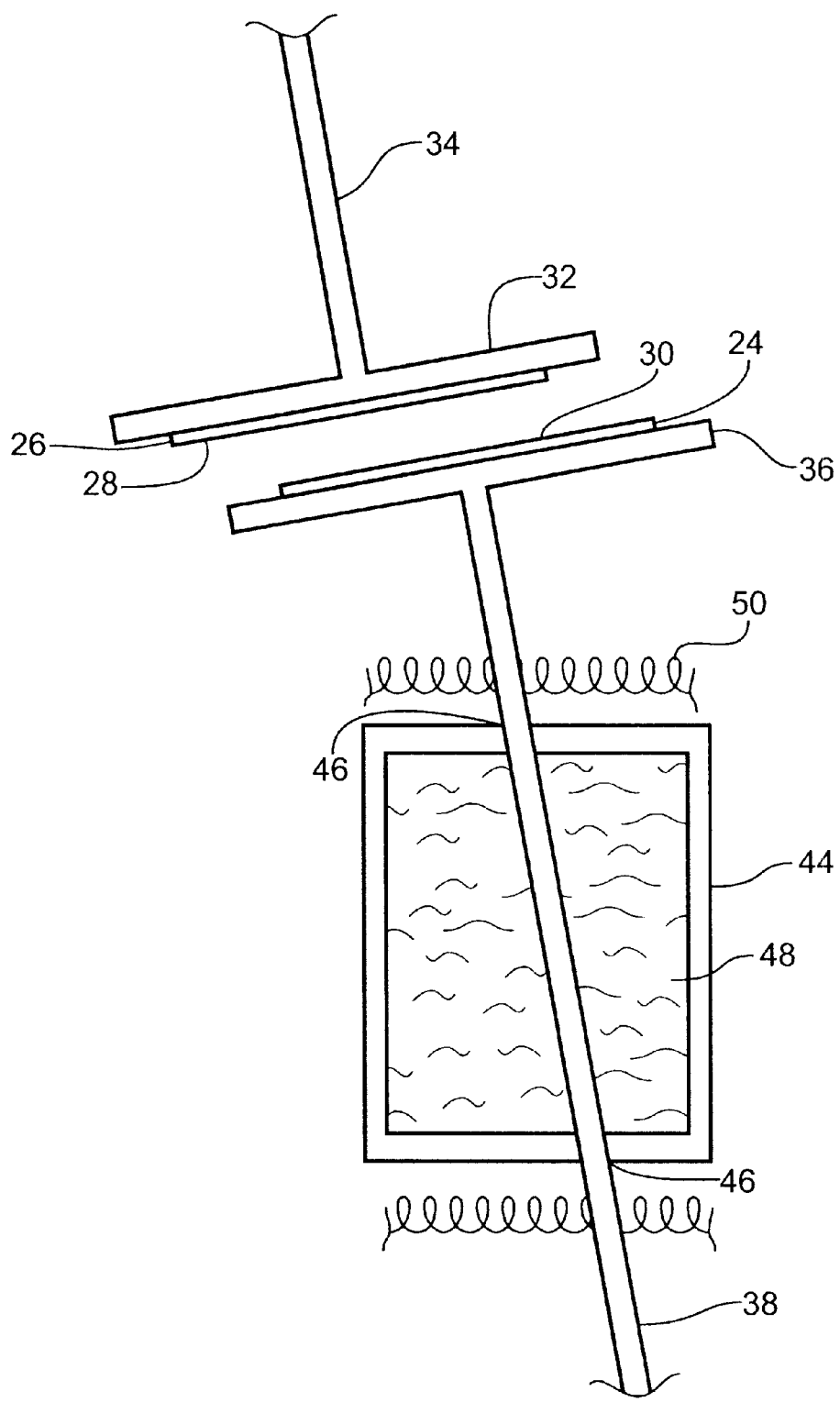
FIG. 3 illustrates a side view of a polishing system according to a second embodiment.

The adjustable axis of rotation of the wafer head 36, for example, is adjustable by angle $\theta_2$. To adjust the angle $\theta_2$, bearings 40 connect with the wafer spindle 38 and at least one fin 42, and preferably multiple fins, attach to the bearings 40. The fins 42 enter a casing 44, for example, via a seal 46. The seal 46 allows the fins 42 to move relative to the casing 44 while maintaining the fluid 48 in the casing 44. The fins 42 increase load-bearing area of the wafer spindle 38 to reduce load per unit area encountered by the fluid 48. Referring also to FIG. 3, in an alternate embodiment, the fins 42 are eliminated when the fluid 48 can harden sufficiently to support the wafer spindle 38 without the fins 48.

Preferably, the fluid 48, enclosed in the casing 44, encompasses the fins 42. Alternatively, the fluid 48 can directly encompass the wafer spindle 38. The fluid 48 is preferably a magneto-rheological fluid that is commercially available and includes iron particles in the fluid. Those skilled in the art will appreciate that other fluids with similar properties to the magneto-rheological fluid could be used that perform the same functions of the magneto-rheological fluid as described below. Other materials, such as a gas or a powder, could be used that allow change in viscosity, so long as the response time of the state change is fast enough for the application. In the present embodiments, a response time in the order of milliseconds is preferred.

In a first state, the magneto-rheological fluid 42 exhibits the properties of a liquid, and in a second state, when a magnetic field is applied at or proximate to the magneto-rheological fluid 42, the fluid 48 undergoes an apparent change of state and exhibits the properties of a solid or a fluid with high viscosity, i.e., high resistance to flow. When the fluid 48 is solid, the fluid 48 maintains a position of the fins 46, thereby maintaining an axial position of the wafer spindle 38.

To apply a magnetic field to the fluid, the system includes at least one flux guide such as electromagnetic coil 50. In the preferred embodiment, the coils 50 have a substantially circular cross-section. Preferably, the flux guides' shapes and sizes emanate the desired flux intensity to the desired locations. It should be noted, however, that flux guides are not limited to the illustrated dimensions, lengths, or the cross-sections of the coils 50 shown in the accompanying figures. Thus, the substantially circular cross-section shapes of the coils 50, their positions proximate to the casing 44, and their illustrated diameters, illustrate only a few of the many forms that this aspect of the flux guide can take. The coils 50, for example, can have a polygonal cross-section and/or be positioned across the entire or a portion of the width or the length of the casing 44. Preferably, the magnetic field can be tuned to control the viscosity of the fluid to control the rate of axial adjustment, depending on the application requirements. As described in more detail below, the magnetic field can be alternately applied and disengaged to continually adjust and set the axis of rotation of the wafer spindle.

Figure 4:
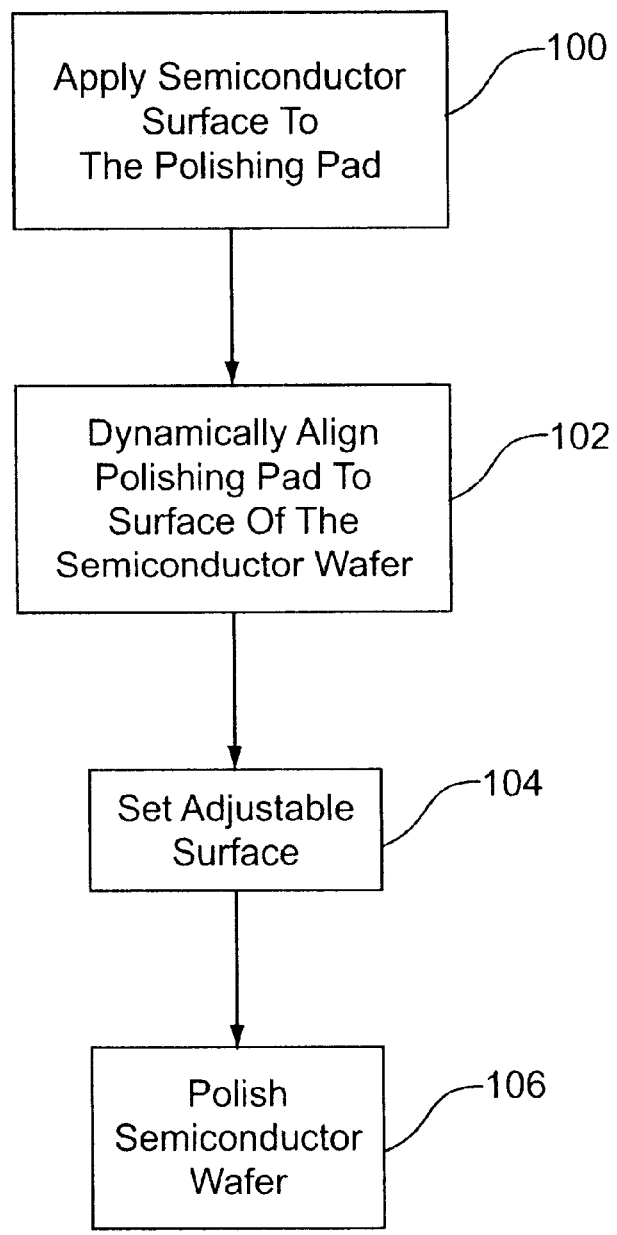
FIG. 4 is a flow chart representation of a polishing method according to the preferred embodiments.

Referring to FIG. 4, a method for using the above-described system is disclosed. To polish the semiconductor wafer 24, the semiconductor surface 30 is applied against the polishing pad 26 (block 106). Alternatively, those skilled in the art will appreciate that the polishing pad 26 can be applied against the semiconductor surface 30. When the semiconductor surface 30 is first applied to the polishing pad 26, the fluid 48 is preferably in a liquid state and the semiconductor surface 30 is preferably centered with the polishing pad 26. Also, as described above, an angle $\theta_2$ of at least one of the wafer spindle 38 and the polishing spindle 34 is adjustable.

Since the fluid 48 is in a liquid or viscous state and at least one of the spindles 34, 38 is adjustable, the axis of rotation of the polishing spindle 34 and the wafer spindle 38 automatically become aligned as the semiconductor surface 30 and the polishing pad 26 engage each other (block 102). The automatic alignment is accomplished, for example, by matching the wafer head 36 and the polishing head 32, where one of the heads 32, 36 is fixed and the other is adjustable. When the two heads 32, 36 come into contact, force from the fixed head positions the adjustable head. In alternate embodiments, the alignment of the polishing spindle 34 and the wafer spindle 38 can be accomplished by line-of-sight and manual adjustment or with a laser sight and automatic or manual adjustment.

When the semiconductor surface 30 and the polishing pad 26 align, the electric coil 50 is energized to create a magnetic field which turns the fluid 48 from a liquid to a solid state and thereby maintains the current angle of the axis of rotation of the spindles 34, 38 (block 104). Thereafter, the polishing pad 26 is used to polish the semiconductor wafer surface 30 (block 106). After completion of the polishing process, the electric coil 50 is shut off to allow the fluid 48 to return to the liquid state so that realignment can occur for a next process to run.

In another embodiment, the electric coil 50 is alternately energized and de-energized to apply and disengage the magnetic field to the fluid 48. By alternately applying and disengaging or reducing the magnetic field, the fluid is alternately solidified and liquefied, which allows for the continual adjustment and setting of the angle of the axis of rotation. Continual adjustment of the angle of the axis of rotation can reduce system vibration, and, as the polishing pad 26 moves across the semiconductor wafer 24 and to the edge of the semiconductor wafer, the polishing pad is held rigid without the edge effect problem of many conventional systems, such as the gimbal system.

In yet another embodiment, the electric coil 50 is energized at the beginning of a series of runs to create a magnetic field which turns the fluid 48 from a liquid to a solid state and thereby maintains the current angle of the axis of rotation of the spindles 34, 38 (block 104). Thereafter, the polishing pad 26 is used to polish the semiconductor wafer surface 30 (block 106). After completion of the polishing process, the electric coil 50 is maintained in an active state such that the initial alignment is maintained until the series of runs is complete after which the he coil shut off to allow the fluid 48 to return to the liquid state so that realignment can occur for the next series of process runs.

Although the preferred embodiments have been described in reference to a circular polishing application, it can be readily adopted to other applications that utilize axial alignment to a fixed surface. For example, the preferred embodiments could be used with lathes, mills and lapping tools. Further embodiments could be used in semiconductor processing etch or deposition chambers where a rotating wafer chuck (susceptor) must be aligned to first and second facing electrode to achieve parallelism of the chuck and electrode.

In the etch or deposition chambers, a first electrode surface and a second electrode surface are provided to the system. The semiconductor wafer 24 is provided on one of the first and second electrode surfaces. An axis of the first electrode surface and the second electrode surface are aligned to each other. To accommodate alignment, at least one of the first and second electrode surfaces includes an adjustable axis perpendicular to the surface of the adjustable axis. After alignment of the first and second electrode surfaces, axial alignment of the adjustable surface is set to maintain a position of the adjustable axis. Thereafter, the semiconductor wafer 24 is etched or film is deposited on the semiconductor wafer 24.

Although the descriptions teach alignment of rotating bodies, this invention can be applied to any non-rotating system of bodies which require parallelism and axial alignment. It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

We claim:

1. An apparatus for polishing a semiconductor wafer, comprising:
    a polishing pad including a first surface;
    a semiconductor wafer including a second surface opposing the first surface of the polishing pad, wherein at least one of an axis of rotation of the first surface and the second surface is adjustable; and
    a magneto-rheological fluid positioned around the axis of rotation of the adjustable surface, wherein the magneto-rheological fluid is operable to maintain a position of the axis of rotation after the axis of rotation of the first and second surfaces are aligned, wherein the semiconductor wafer is polished with the polishing pad after the axis of rotation are aligned.

2. The apparatus according to claim 1 wherein a magnetic field is applied proximate to the magneto-rheological fluid to set or solidify the magneto-rheological fluid.

3. The apparatus according to claim 2 further including an electrical coil located proximate to the magneto-rheological fluid, wherein application of the magnetic field comprises energizing the electric coil.

4. The apparatus according to claim 2 wherein the magneto-rheological fluid becomes solid after the magnetic field is applied.

5. The apparatus according to claim 2 wherein the magneto-rheological fluid becomes highly viscous after the magnetic field is applied.

6. The apparatus according to claim 2 wherein the magnetic field is alternately applied and disengaged to continually adjust and set the axis of rotation of the first surface to the second surface.

7. The apparatus according to claim 1 further including a first spindle shaft attached with the polishing pad and a second spindle shaft attached with the semiconductor wafer to spin the polishing pad and semiconductor wafer.

8. The apparatus according to claim 7 wherein at least one of the first spindle shaft and the second spindle shaft are enclosed within the fluid.

9. The apparatus according to claim 7 further including at least one fin attached with at least one of the first spindle shaft and the second spindle shaft wherein the at least one fin is surrounded by the fluid.

10. An apparatus for polishing a semiconductor wafer, comprising:
    a spindle including an adjustable axis of rotation, wherein the spindle operates to rotate at least one of a polishing pad and a semiconductor wafer;
    a casing located proximate to the spindle;
    a magneto-rheological fluid contained in the casing, at least a portion of the fluid being operably connected with the spindle; and
    an adjustable magnetic field directed to the magneto-rheological fluid, wherein the magneto-rheological fluid is responsive to the adjustable magnetic field to maintain a position of an axis of rotation of the spindle.

11. The apparatus according to claim 10 wherein the fluid surrounds the spindle.

12. The apparatus according to claim 10 further including at least one fin attached with the spindle.

13. The apparatus according to claim 12 further wherein the fluid surrounds the fin.

14. An apparatus for polishing a semiconductor wafer, comprising:
    a spindle including an adjustable axis of rotation, wherein the spindle operates to rotate at least one of a polishing pad and a semiconductor wafer; and
    a magneto-rheological fluid surrounding at least a portion of the spindle, wherein the magneto-rheological fluid is operable to maintain a position of the axis of rotation of the spindle.

15. The apparatus according to claim 14 further including an adjustable magnetic field directed to the fluid, wherein the fluid is responsive to the adjustable magnetic field to maintain a position of an axis of rotation of the spindle.

16. The apparatus according to claim 14 further including at least one fin attached with the spindle.

17. The apparatus according to claim 16 further wherein the fluid surrounds the fin.

* * * * *